(12) United States Patent
Lu et al.

(10) Patent No.: US 10,446,325 B2
(45) Date of Patent: Oct. 15, 2019

(54) CAPACITOR STRUCTURES

(71) Applicant: Advanced Semiconductor Engineering, Inc., Kaohsiung (TW)

(72) Inventors: Wen-Long Lu, Kaohsiung (TW); Chi-Chang Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/721,263

(22) Filed: Sep. 29, 2017

(65) Prior Publication Data
US 2019/0103227 A1  Apr. 4, 2019

(51) Int. Cl.
| H01G 4/33 | (2006.01) |
| H01G 4/228 | (2006.01) |
| H01G 4/12 | (2006.01) |
| H01G 4/38 | (2006.01) |
| H01G 4/012 | (2006.01) |
| H01G 4/224 | (2006.01) |
| H01L 27/01 | (2006.01) |
| H01L 49/02 | (2006.01) |

(52) U.S. Cl.
CPC ............. *H01G 4/33* (2013.01); *H01G 4/012* (2013.01); *H01G 4/1254* (2013.01); *H01G 4/224* (2013.01); *H01G 4/228* (2013.01); *H01G 4/385* (2013.01); *H01L 27/016* (2013.01); *H01L 28/91* (2013.01)

(58) Field of Classification Search
CPC ........ H01G 4/33; H01G 4/012; H01G 4/1254; H01G 4/224; H01G 4/228; H01G 4/385; H01L 27/016; H01L 28/91
See application file for complete search history.

(56) References Cited

U.S. PATENT DOCUMENTS

| 5,796,573 | A | * | 8/1998 | Kotecki | .............. H01L 27/1085 257/303 |
| 6,417,535 | B1 | | 7/2002 | Johnson et al. | |
| 6,620,701 | B2 | | 9/2003 | Ning | |
| 7,755,164 | B1 | * | 7/2010 | Rinne | ................... H01L 27/016 257/531 |
| 2002/0176989 | A1 | * | 11/2002 | Knudsen | ................ H01G 4/206 428/408 |
| 2004/0130849 | A1 | * | 7/2004 | Kurihara | ................ H01G 4/228 361/311 |
| 2005/0142733 | A1 | * | 6/2005 | Kurihara | ................... H01G 4/33 438/250 |

(Continued)

*Primary Examiner* — Dion Ferguson
(74) *Attorney, Agent, or Firm* — Foley & Lardner LLP; Cliff Z. Liu

(57) ABSTRACT

A capacitor structure is disclosed. The capacitor structure includes a substrate, and a first electrode disposed on the substrate, the first electrode including a conductive layer, a first conductive post electrically connected to the conductive layer and a second conductive post electrically connected to the conductive layer. The capacitor structure further includes a planarization layer disposed on and covering the first electrode, the planarization layer disposed in a space between the first conductive post and the second conductive post, a first dielectric layer disposed on the planarization layer and in the space between the first conductive post and the second conductive post, and a second electrode disposed on the first dielectric layer.

19 Claims, 26 Drawing Sheets

(56) References Cited

U.S. PATENT DOCUMENTS

| | | | |
|---|---|---|---|
| 2007/0235790 A1* | 10/2007 | Kim | H01L 23/5223 |
| | | | 257/306 |
| 2013/0241939 A1* | 9/2013 | Lasiter | H01L 23/642 |
| | | | 345/501 |
| 2016/0293334 A1* | 10/2016 | Ehara | H01G 4/008 |
| 2017/0310296 A1* | 10/2017 | Hahn | H03H 7/32 |

* cited by examiner

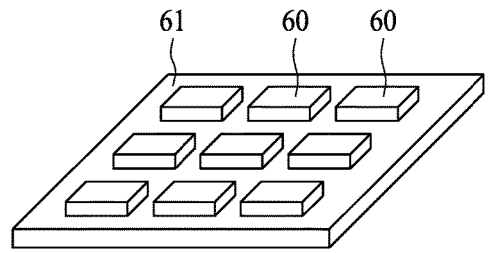 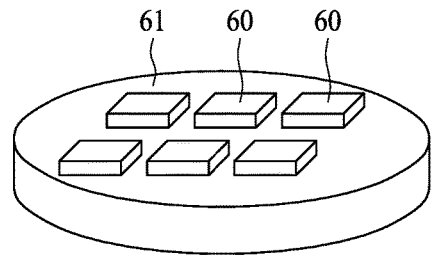
FIG. 6A                FIG. 6B
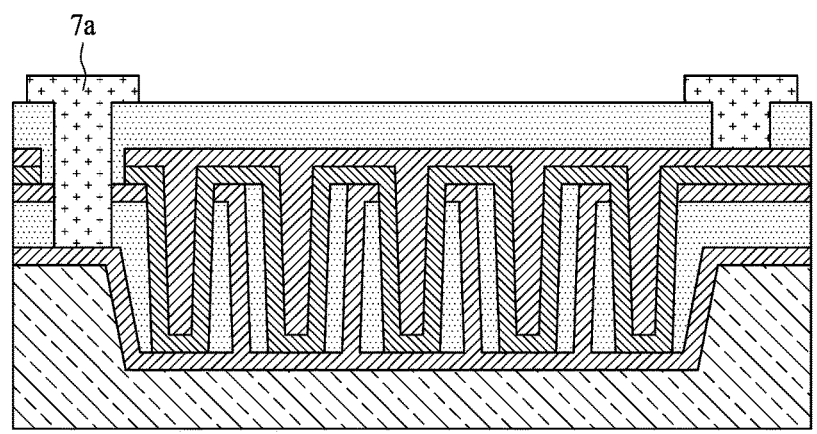
FIG. 7A

CAPACITOR STRUCTURES

TECHNICAL FIELD

The present disclosure generally relates to capacitor structures, and to capacitor structures including a planarization layer.

BACKGROUND

For some comparative capacitors, capacitance of the capacitors may depend on a quantity of electrode layers and dielectric layers. In order to have a relatively higher capacitance, a number of electrode layers and dielectric layers can be increased, which can significantly increase the overall thickness of the capacitors.

Capacitors can be made using integrated passive devices (IPD) techniques to achieve a higher capacitance. However, the overall thickness of the capacitors made by IPD may still be too large for integration of the capacitors into some smaller devices.

SUMMARY

In some embodiments, a capacitor structure is provided. The capacitor structure includes a substrate, and a first electrode disposed on the substrate, the first electrode including a conductive layer, a first conductive post electrically connected to the conductive layer and a second conductive post electrically connected to the conductive layer. The capacitor structure further includes a planarization layer disposed on and covering the first electrode, the planarization layer disposed in a space between the first conductive post and the second conductive post, a first dielectric layer disposed on the planarization layer and in the space between the first conductive post and the second conductive post, and a second electrode disposed on the first dielectric layer.

In some embodiments, a capacitor structure is provided. The capacitor structure includes a substrate, a first electrode disposed on the substrate, the first electrode including a conductive layer and a plurality of conductive posts, and a first dielectric layer on the first electrode, at least a portion of the first dielectric layer surrounded by the plurality of conductive posts. The capacitor structure further includes a second electrode disposed on the first dielectric layer, a second dielectric layer disposed on the second electrode, a third electrode disposed on the second dielectric layer, a first conductive contact electrically connected to the first and third electrodes, and a second conductive contact electrically connected to the second electrode.

In some embodiments, a capacitor structure is provided. The capacitor structure includes a first dielectric layer, a first conductive layer disposed on the first dielectric layer, at least a portion of the first conductive layer surrounded by the first dielectric layer, and a second dielectric layer disposed on the first conductive layer, at least a portion of the second dielectric layer surrounded by the first conductive layer.

In some embodiments, a method of forming a capacitor structure is provided. The method includes providing a substrate, and forming a first electrode on the substrate, the first electrode including a conductive layer and a plurality of conductive posts disposed on and electrically connected to the conductive layer, the plurality of conductive posts defining at least one first recess having one or more sidewalls and a bottom surface. The method further includes forming a planarization layer overlying the first electrode and covering the one or more sidewalls and the bottom surface of the at least one first recess, forming a first dielectric layer overlying the planarization layer, and forming a second electrode overlying the first dielectric layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 6A and FIG. 6B illustrate examples of different types of semiconductor package devices in accordance with some embodiments of the present disclosure.

FIG. 7A, FIG. 7B, FIG. 7C, and FIG. 7D schematically illustrate various capacitor structures in accordance with some embodiments of the present disclosure.

DETAILED DESCRIPTION

Figure 1:
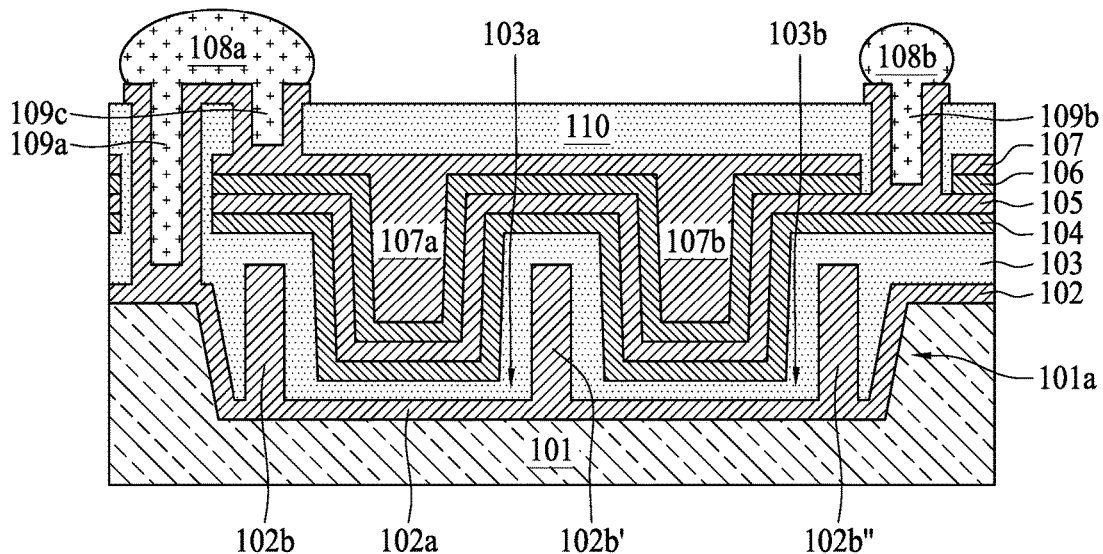
FIG. 1 is a cross-sectional view of a capacitor structure in accordance with some embodiments of the present disclosure.

Manufacturing and use of at least some embodiments of the present disclosure are discussed in detail below. It should be appreciated, however, that at least some embodiments set forth can deviate from the specific examples provided herein such that they can be implemented in a wide variety of specific contexts. It is to be understood that the following disclosure provides many different embodiments or examples of implementing different features of various embodiments. Specific examples of components and configurations are described below for purposes of discussion. These are, of course, merely examples and are not intended to be limiting.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Additional processing steps and/or features can be implemented, and certain of the processing steps and/or features described herein can be removed or changed while implementing the methods described herein or while using the systems and devices described herein. Thus, the following description should be understood to represent examples, and are not intended to suggest that one or more steps or features are required for every implementation.

In addition, the present disclosure may repeat reference numerals and/or letters in the various examples described herein. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may be interpreted accordingly.

FIG. 1 is a cross-sectional view of a capacitor structure 100 in accordance with some embodiments of the present disclosure. The capacitor structure 100 includes a substrate 101. The substrate 101 defines a cavity 101a. The cavity 101a is recessed from a surface (e.g. a top surface) of the substrate 101. The cavity 101a may be formed by removing a portion of the substrate 101. The capacitor structure 100 includes an electrode 102. The electrode 102 is provided on the substrate 101. The electrode 102 may be in direct contact with the substrate 101. An oxide layer (not shown) may be disposed between at least a portion of the electrode 102 and the substrate 101. At least a portion of the electrode 102 may be disposed in the cavity 101a.

The electrode 102 includes a conductive layer 102a. The electrode 102 also includes a plurality of conductive posts, including the conductive post 102b, the conductive post 102b' and the conductive post 102b". The conductive post 102b, the conductive post 102b' and the conductive post 102b" are electrically connected to the conductive layer 102a. The conductive post 102b, the conductive post 102b' and the conductive post 102b" extend upward from an upper surface of the conductive layer 102a. In one or more embodiments, the conductive post 102b, the conductive post 102b' and the conductive post 102b" extend upward from the upper surface of the conductive layer 102a in a substantially vertical configuration (e.g. in a direction orthogonal to a surface of the conductive layer 102a from which the conductive post 102b, the conductive post 102b' and the conductive post 102b" extend). In one or more embodiments, the cavity 101a accommodates at least one of the conductive post 102b, the conductive post 102b' and the conductive post 102b" (e.g. at least a portion of at least one of the conductive post 102b, the conductive post 102b' and the conductive post 102b" is disposed in the cavity 101a). As shown in FIG. 1, the conductive post 102b, the conductive post 102b' and the conductive post 102b" are all formed within the cavity 101a. In one or more embodiments, at least one of the conductive post 102b, the conductive post 102b' and the conductive post 102b" may extend out of the cavity 101a (e.g. may extend above a non-recessed surface of the electrode 102). In one or more embodiments, an aspect ratio of at least one of the conductive post 102b, the conductive post 102b' and the conductive post 102b" is equal to or greater than about 7 (e.g. is equal to or greater than about 8, is equal to or greater than about 9, or is equal to or greater than about 10). The aspect ratio of a conductive post may be defined by a ratio of a height of the conductive post to a width of the conductive post.

The capacitor structure 100 further includes a planarization layer 103. The planarization layer 103 is provided on the first electrode 102 and is configured to cover the first electrode 102. The planarization layer 103 is disposed in a space between two adjacent conductive posts, and at least a portion of the planarization layer 103 may be surrounded by the adjacent conductive posts. As shown in FIG. 1, the planarization layer 103 is disposed in a space 103a between the conductive post 102b and the conductive post 102b', and the planarization layer 103 is disposed in another space 103b between the conductive post 102b' and the conductive post 102b". The space 103a may constitute a recess defined by the first conductive post 102b, the second conductive post 102b', and the conductive layer 102a. The planarization layer 103 may cover one or more sidewalls and a bottom surface of the recess defined by the first conductive post 102b, the second conductive post 102b', and the conductive layer 102a.

The capacitor structure 100 further includes a dielectric layer 104. The dielectric layer 104 is provided on the planarization layer 103. A portion of the dielectric layer 104 is provided in the spaces between two adjacent conductive posts. For example, a portion of the dielectric layer 104 is provided within the space 103a between the conductive post 102b and the conductive post 102b', and a portion of the dielectric layer 104 is provided within the space 103b between the conductive post 102b' and the conductive post 102b". At least a portion of the dielectric layer 104 may be surrounded by the conductive layer 102a. The dielectric layer 104 may include a metal oxide layer (e.g. a layer including a tantalum oxide such as $Ta_2O_5$).

The capacitor structure 100 further includes an electrode 105. The electrode 105 is provided on the dielectric layer 104. A portion of the electrode 105 is provided in the spaces between two adjacent conductive posts. For example, a portion of the electrode 105 is provided within the space 103a between the conductive post 102b and the conductive post 102b', and a portion of the electrode 105 is provided within the space 103b between the conductive post 102b' and the conductive post 102b".

The capacitor structure 100 further includes a dielectric layer 106. The dielectric layer 106 is provided on the electrode 105. A portion of the dielectric layer 106 is provided in spaces between two adjacent conductive posts. For example, a portion of the dielectric layer 106 is provided within the space 103a between the conductive post 102b and the conductive post 102b', and a portion of the dielectric layer 106 is provided within the space 103b between the conductive post 102b' and the conductive post 102b". At least a portion of the electrode 105 may be surrounded by the dielectric layer 104, and at least a portion of the dielectric layer 106 may be surrounded by the electrode 105 (e.g. by the portion of the electrode 105 surrounded by the dielectric layer 104).

The capacitor structure 100 further includes an electrode 107. The electrode 107 is provided on the dielectric layer 106. A portion of the electrode 107 is provided in the spaces between two adjacent conductive posts. At least a portion of the electrode 107 may be surrounded by the dielectric layer 106. A portion of the electrode 107 is disposed in the space 103a and the space 103b. For example, a conductive post 107a defined by the electrode 107 extends in to the space 103a and a conductive post 107b of the electrode 107 extends in to the space 103b.

The capacitor structure 100 further includes a dielectric layer 110. The dielectric layer 110 is provided on the electrode 107 and is configured to cover the electrode 107.

As shown in FIG. 1, the electrode 102 is electrically connected to a conductive contact 108a by a conductive via 109a. The electrode 105 is electrically connected to a conductive contact 108b by second conductive via 109b. The electrode 107 is electrically connected to the conductive contact 108a by a conductive via 109c. Thus, the electrode 102 and the electrode 107 are both electrically connected to the conductive contact 108a.

Figure 2:
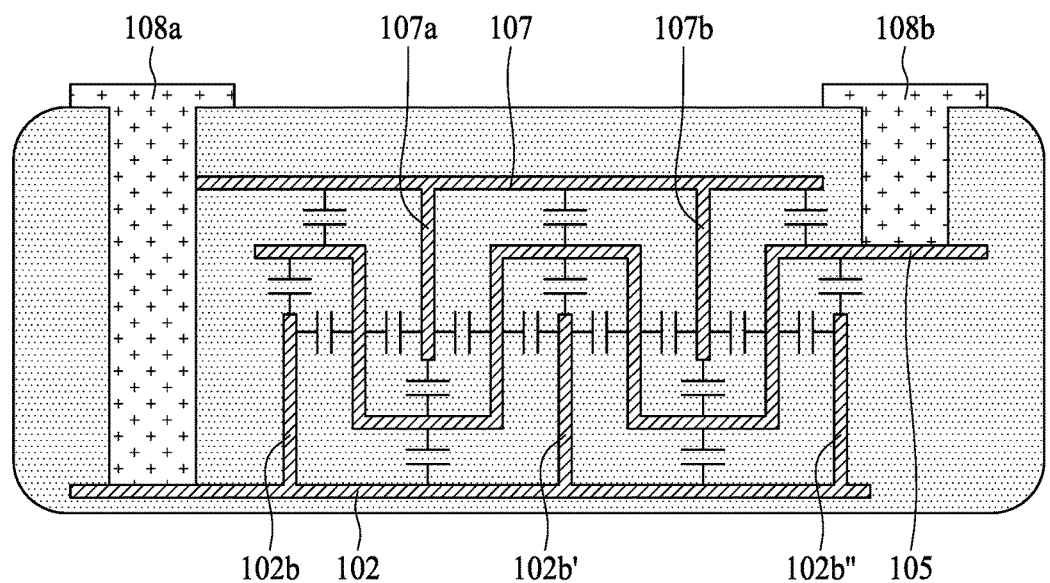
FIG. 2 shows a circuit diagram corresponding to the capacitor structure shown in FIG. 1 in accordance with some embodiments of the present disclosure.

FIG. 2 shows a circuit diagram corresponding to the capacitor structure 100 of FIG. 1. As shown in FIG. 2, the electrode 102 and the electrode 107 are electrically connected to the conductive contact 108a, and the electrode 105 is electrically connected to the conductive contact 108b. As shown in FIG. 2, there exists capacitance between the electrode 105 and each of the conductive layer 102a and the conductive post 102b, the conductive post 102b' and the conductive post 102b" and there exists capacitance between electrode 105 and each of the conductive layer 107 and the conductive posts 107a and 107b. Therefore, due to the arrangement and configuration of the capacitor structure 100, a total capacitance value for the capacitor structure 100 is much higher than a total capacitance value for some comparative capacitor structures. Additionally, the high aspect ratio of the conductive post 102b, the conductive post 102b' and the conductive post 102b" (e.g. equal to or greater than about 7, equal to or greater than about 8, equal to or greater than about 9, or equal to or greater than about 10) provides for a larger area between the electrode 105 and the conductive post 102b, the conductive post 102b', and the conductive post b", which also provides for a high capacitance of the capacitor structure 100.

Figure 3A:
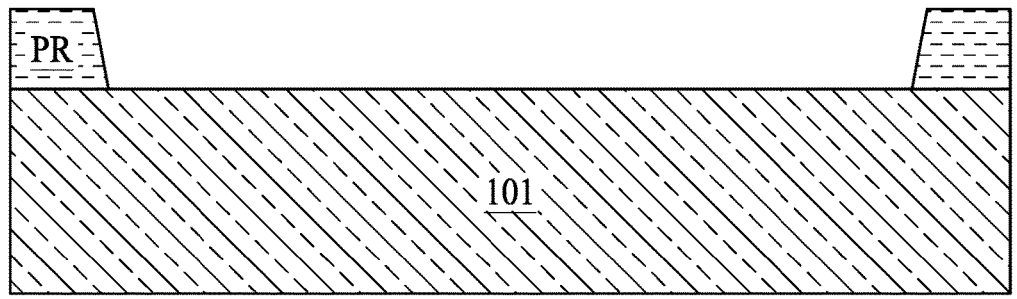
FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M, FIG. 3N, FIG. 3O, FIG. 3P, FIG. 3Q, FIG. 3R, FIG. 3S, FIG. 3T, FIG. 3U, FIG. 3V, and FIG. 3W schematically illustrate operations for manufacturing a capacitor structure in accordance with some embodiments of the present disclosure.
Figure 3B:
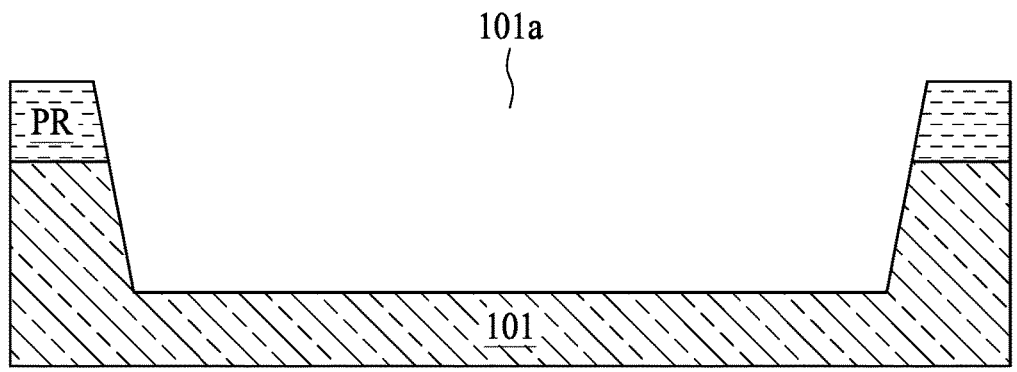
Figure 3C:
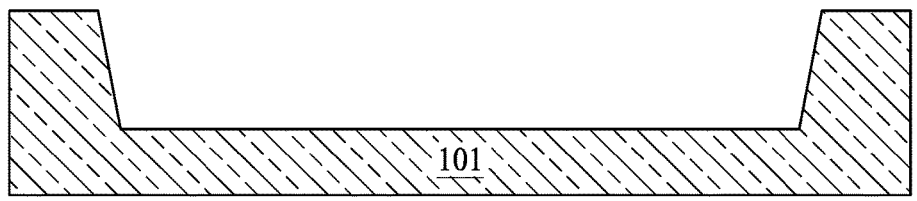
Figure 3D:
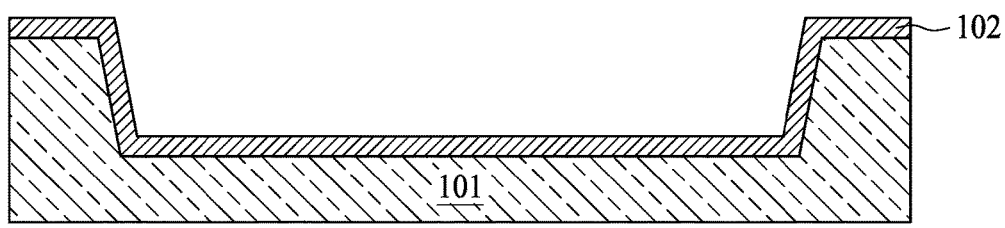
Figure 3E:
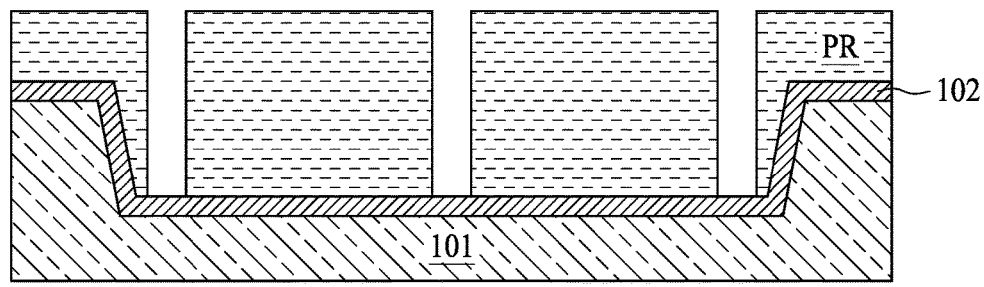
Figure 3F:
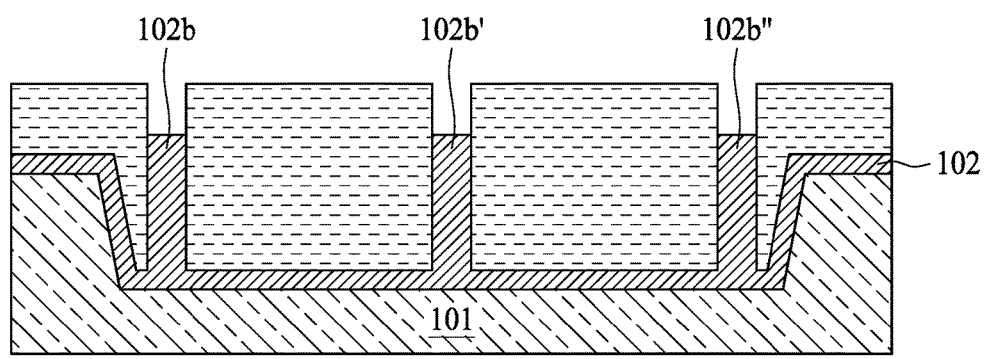
Figure 3G:
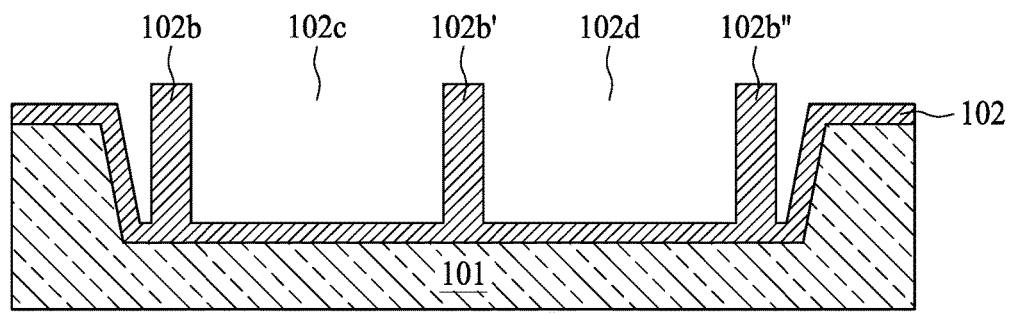
Figure 3H:
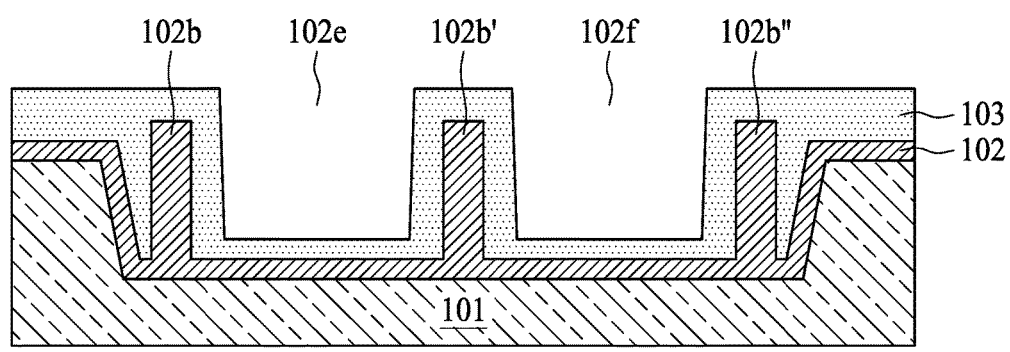
Figure 3I:
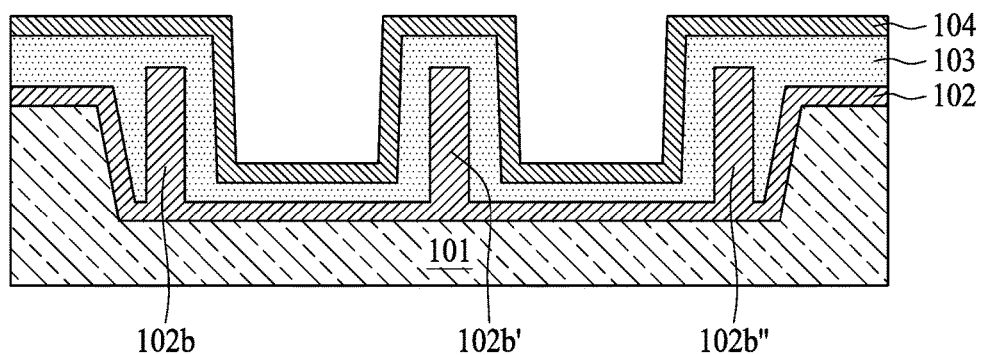
Figure 3J:
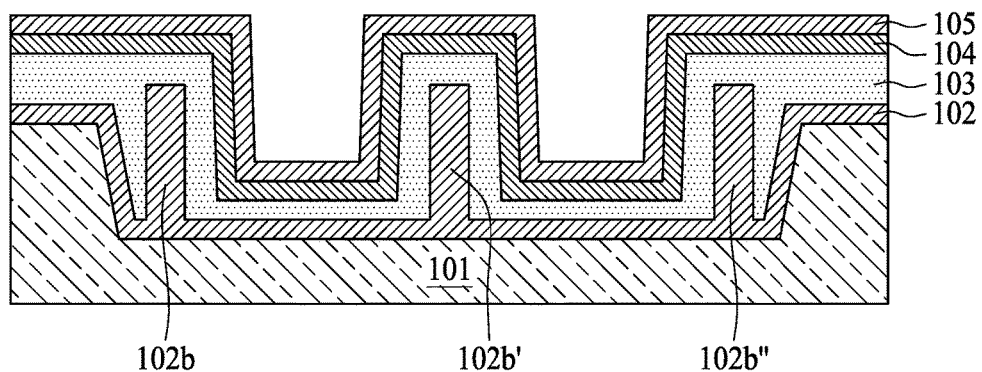
Figure 3K:
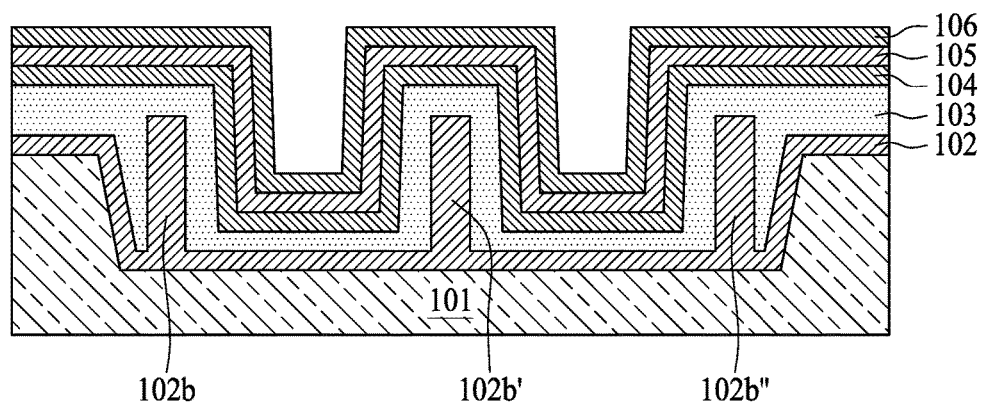
Figure 3L:
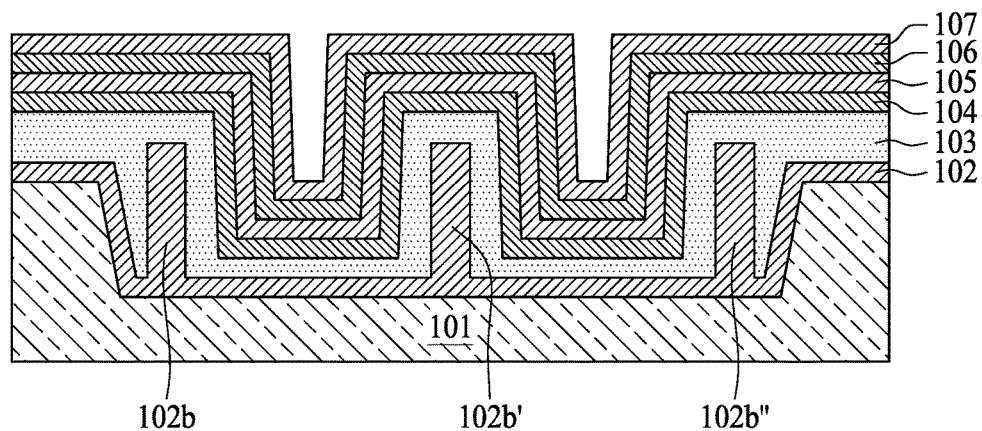
Figure 3M:
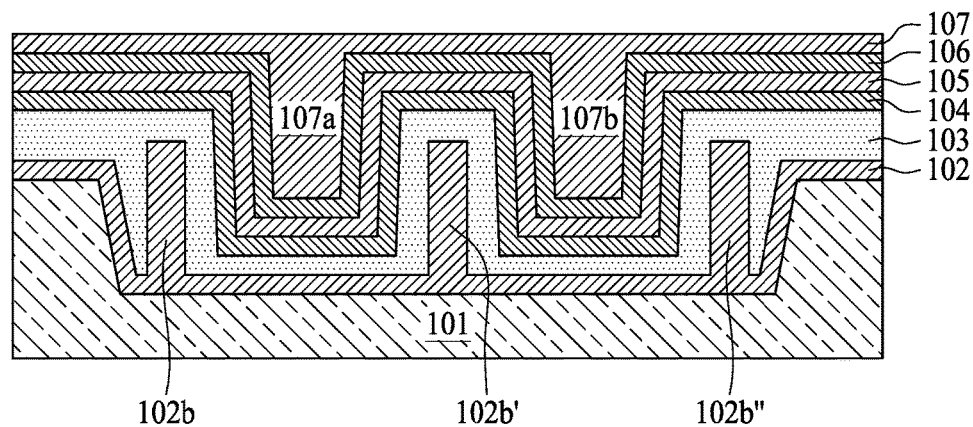
Figure 3N:
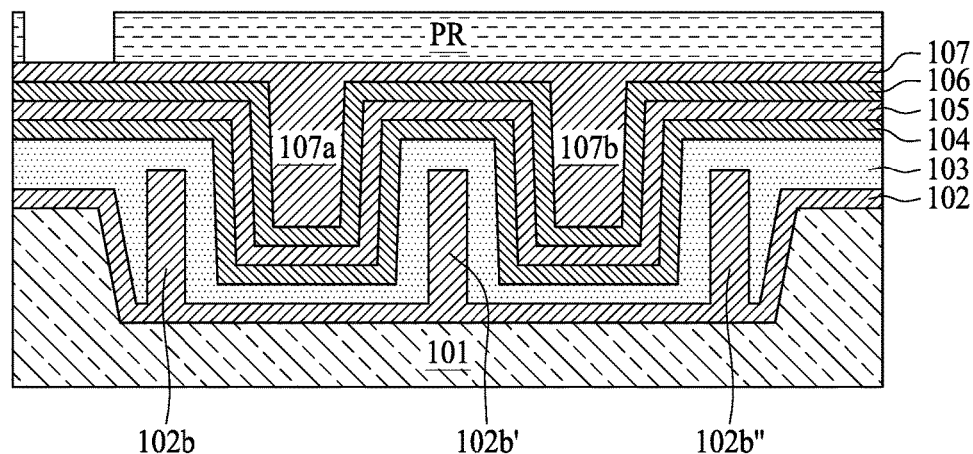
Figure 3O:
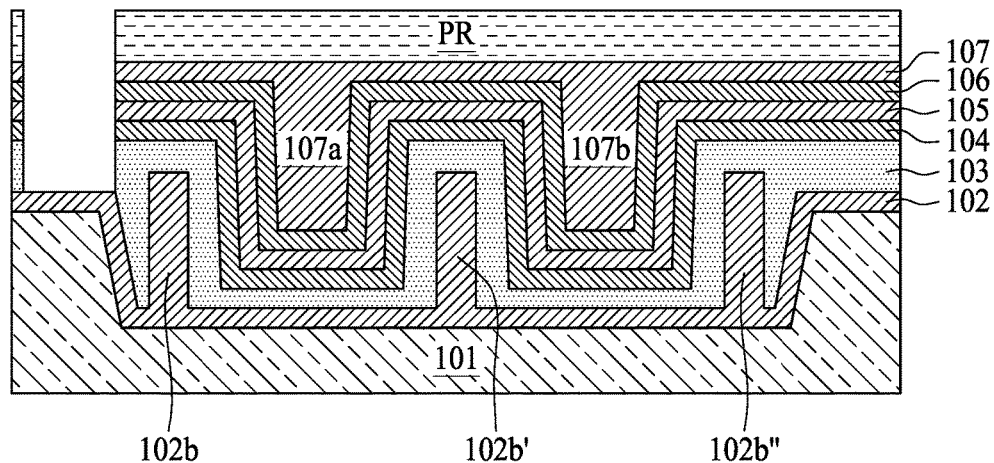
Figure 3P:
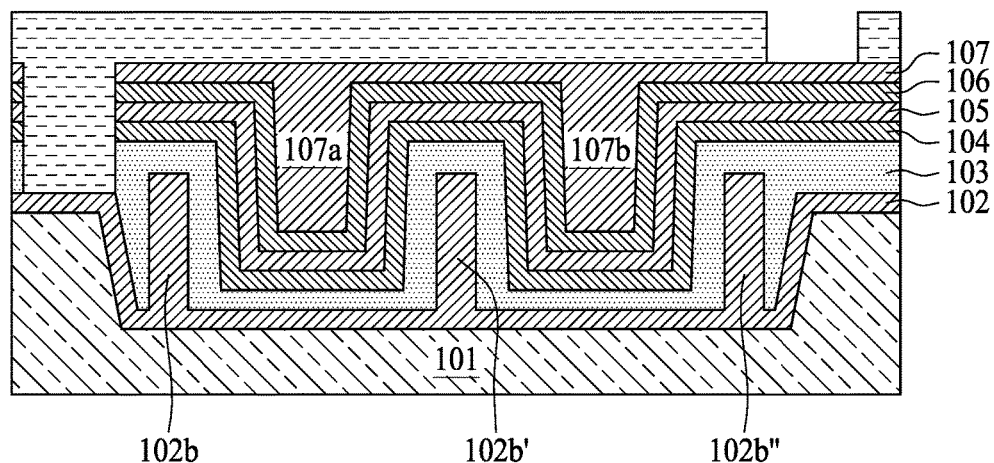
Figure 3Q:
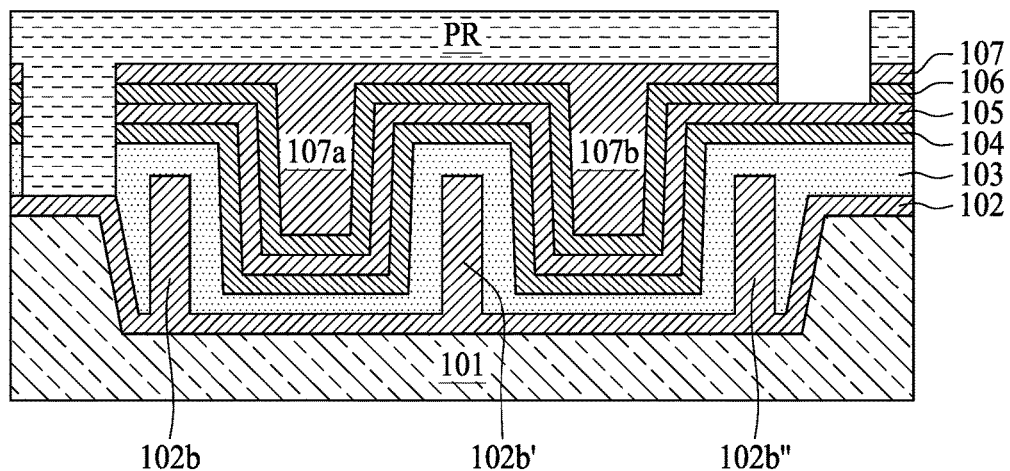
Figure 3R:
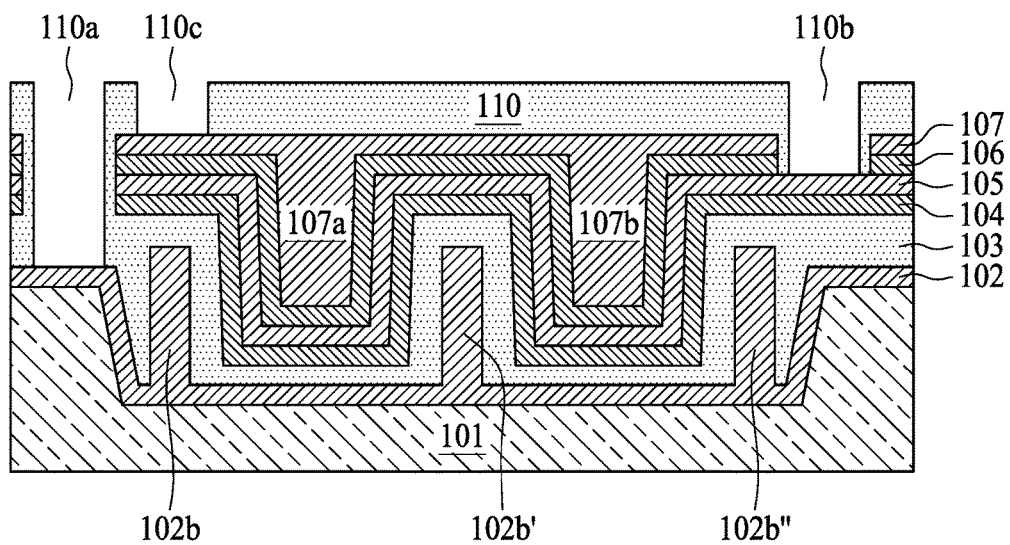
Figure 3S:
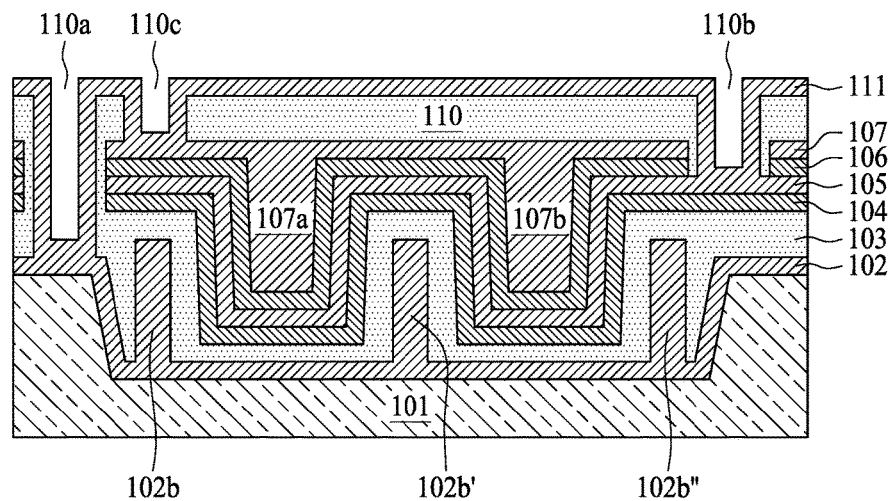
Figure 3T:
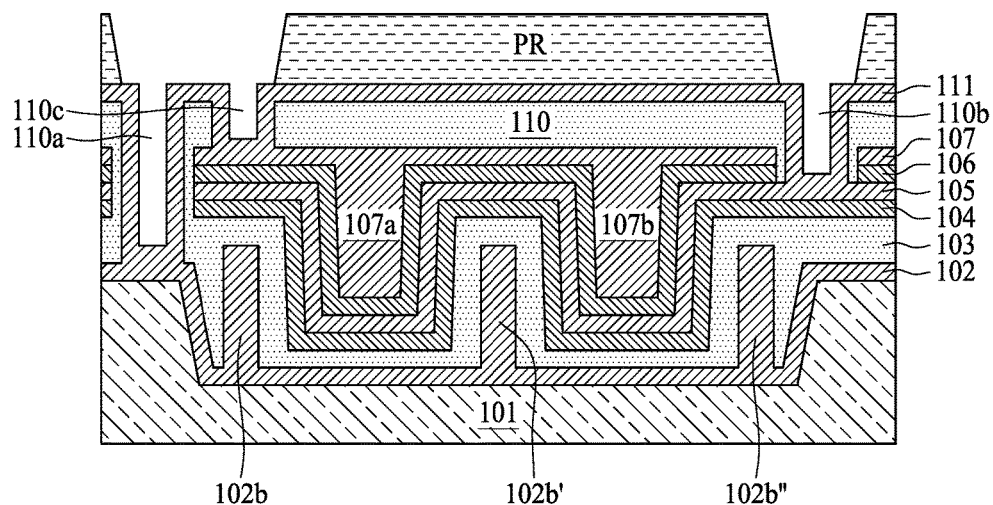
Figure 3U:
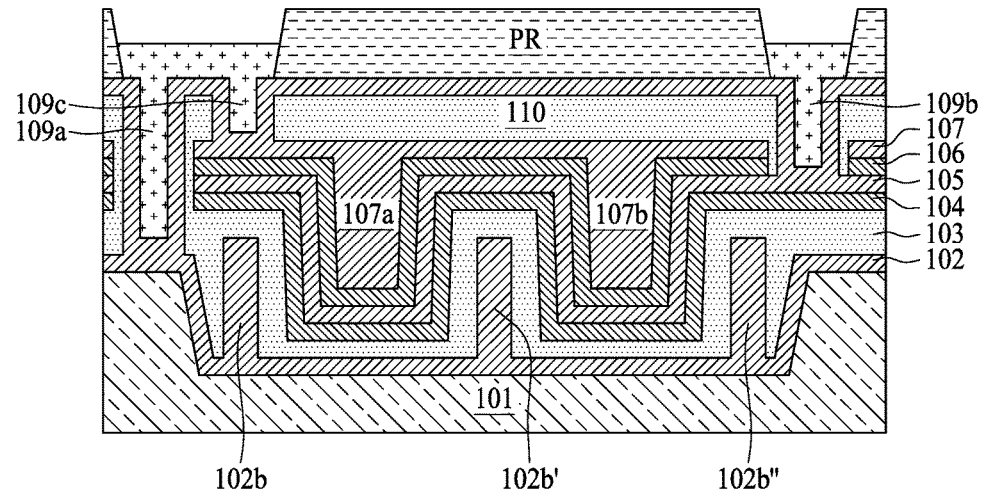
Figure 3V:
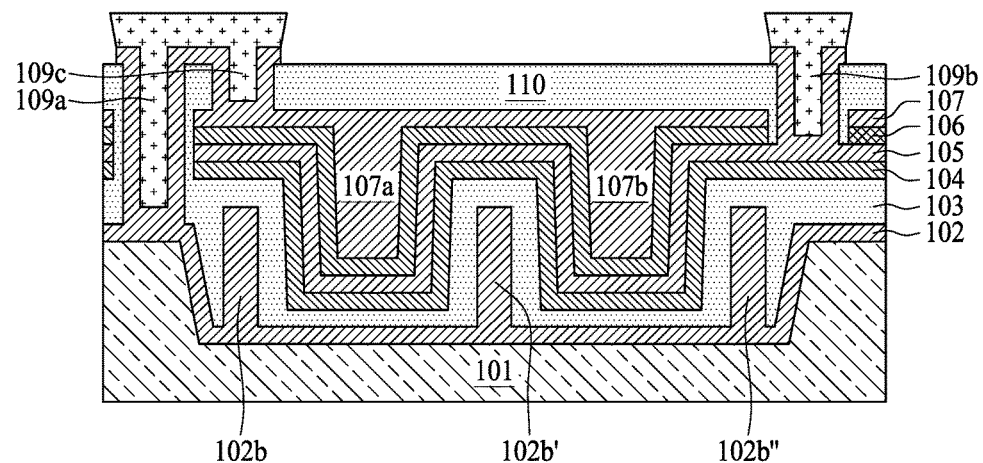
Figure 3W:
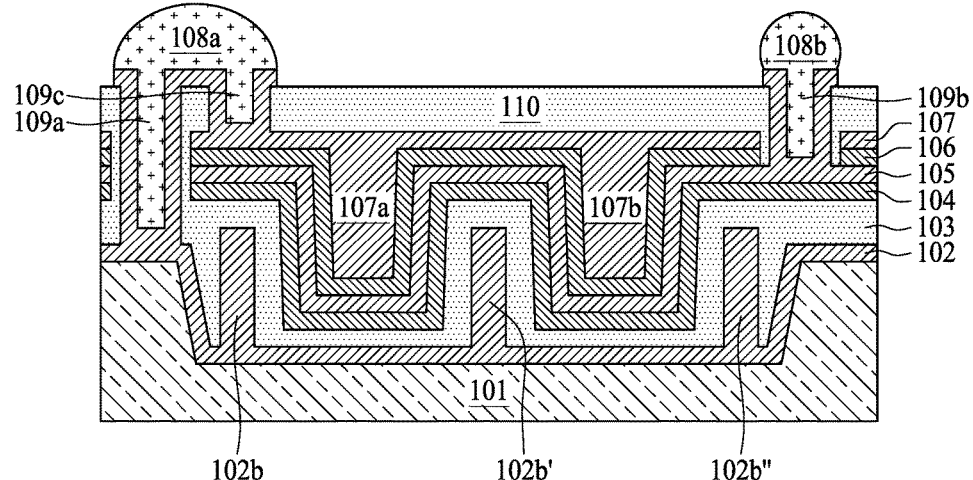

FIG. 3A through FIG. 3W schematically illustrate operations for manufacturing a capacitor structure in accordance with some embodiments of the present disclosure. In FIG. 3A, a substrate 101 is provided. A photoresist PR layer is applied (e.g. by coating) on to an upper surface of the substrate 101. The photoresist PR layer is patterned by removing a portion of the PR layer. The remaining PR layer exposes a portion of the upper surface of the substrate 101.

In FIG. 3B, a cavity 101a is formed by etching the exposed portion of the substrate 101 (by, e.g., deep reactive-ion etching). In FIG. 3C, the remaining PR layer is removed by wet stripping or dry stripping. In FIG. 3D, a conductive layer is formed on the substrate 101 as an electrode layer 102. The electrode layer 102 may be deposited on the substrate 101 by sputtering. In one or more embodiments, the electrode layer 102 is includes copper (Cu), an aluminum-copper alloy (AlCu), a tantalum-copper alloy (TaCu), or another metal or metal alloy.

In FIG. 3E, a photoresist PR layer is applied on to the electrode layer 102. The photoresist PR layer is disposed in (e.g. completely fills) the cavity 101a. A plurality of through holes is formed through the photoresist PR layer to reach the electrode layer 102. The plurality of through holes is formed within the cavity 101a.

In FIG. 3F, a conductive post 102b, a conductive post 102b' and a conductive post 102b" are formed in the through holes (e.g. fill the through holes, at least in part) and are electrically coupled to the conductive layer 102. The conductive post 102b, the conductive post 102b' and the conductive post 102b" may be formed by electroplating. In FIG. 3G, the photoresist PR layer is removed to expose the conductive post 102b, the conductive post 102b' and the conductive post 102b". The conductive post 102b and the conductive post 102b' define a recess 102c, and the conductive post 102b' and the conductive post 102b" define a /recess 102d.

In FIG. 3H, a planarization layer 103 is formed to overlie the electrode layer 102 (including the conductive post 102b, the conductive post 102b' and the conductive post 102b") and covers sidewalls and bottom surfaces of the recess 102c and the recess 102d. Forming the planarization layer 103 may include filling the recess 102c and the recess 102d, at least in part, with a photosensitive polymer layer and optically removing the photosensitive polymer layer to define a recess 102e and a recess 102f (which may respectively correspond to the recess 102c and the recess 102d). Both the operation of FIG. 3G and the configuration of the electrode layer 102 (including the conductive post 102b, the conductive post 102b' and the conductive post 102b") can lead to a rough or uneven surface of the structure. The planarization layer 103 (e.g. with controlled and reduced surface roughness) thus serves to reduce the surface roughness of the structure and facilitate application/deposition of subsequent layers. The planarization layer 103 may include an organic macromolecule polymer layer, and the organic macromolecule polymer layer may include a photosensitive polyimide (PI) layer.

A dielectric layer may have a thickness of approximately 2500 angstroms (Å), the substrate 101 may have surface roughness of approximately 1100 Å, and the etched surface of the substrate 101 may have surface roughness of approximately 2300 Å. Greater surface roughness may lead to an uneven dielectric layer which may adversely affect performance or characteristics (e.g. capacitance) of the capacitor. Current leakage may occur at a relatively thin portion of the uneven dielectric layer. Unevenness may result in breaking or discontinuity of the dielectric layer or the electrode layer. The planarization layer 103 may compensate for surface roughness (caused by, for example plating operation) of the electrode layer 102 (including the conductive post 102b, the conductive post 102b' and the conductive post 102b"). The planarization layer 103 may compensate for surface roughness of the substrate 101. The planarization layer 103 may provide for each of the dielectric layer(s) and the electrode layer(s) formed thereon having a relatively uniform thickness. A relatively even dielectric layer may be formed on the planarization layer 103. A relatively even electrode layer may be formed on the planarization layer 103. Current leakage issues due to unevenness of the dielectric layer may be addressed by the arrangement of the planarization layer 103. Breaking issues of the dielectric layer formed on the planarization layer 103 may be addressed by the arrangement of the planarization layer 103. Breaking issues of the electrode layer formed on the planarization layer 103 may be addressed by the arrangement of the planarization layer 103. The uniform thickness of the planarization layer 103 helps prevent discontinuities (e.g. helps prevent an open circuit) of the dielectric layer(s) or electrode layer(s) formed thereon.

In FIG. 3I, a dielectric layer 104 is provided on the planarization layer 103 and a portion of the dielectric layer 104 is provided within the recess 102e and the recess 102f. In one or more embodiments, forming the dielectric layer 104 includes sputtering a Ta layer on to the planarization layer 103 and then performing anode oxidation to the Ta layer to turn it into a layer of $Ta_2O_5$. In FIG. 3J, a conductive layer is formed on the dielectric layer 104 as an electrode layer 105. The electrode layer 105 may be deposited on the dielectric layer 104 by sputtering. In one or more embodiments, the electrode layer 105 includes Cu, AlCu, TaCu, or another metal or metal alloy. In FIG. 3K, a dielectric layer 106 is provided on the electrode layer 105. In one or more embodiments, forming the dielectric layer 106 includes sputtering a Ta layer on to the electrode layer 105 and then performing anode oxidation to the Ta layer to turn it into a layer of $Ta_2O_5$. In FIG. 3L, a conductive layer is formed on the dielectric layer 106 as an electrode layer 107. The electrode layer 107 may be deposited on the dielectric layer 106 by sputtering. In one or more embodiments, the electrode layer 107 includes Cu, AlCu, TaCu, or an alloy thereof. In FIG. 3M, a conductive post 107a and a conductive post 107b are formed on the electrode layer 107 and are electrically coupled to the electrode layer 107.

In FIG. 3N, a photoresist PR layer is applied on to the electrode layer 107. The photoresist PR layer is patterned and the remaining PR layer exposes a portion of the electrode layer 107. In FIG. 3O, a through hole through the photoresist PR layer and the planarization layer 103, the dielectric layer 104, the electrode 105, the dielectric layer 106, a/nd the electrode layer 107 (components 103-107) is formed to reach the electrode layer 102 (e.g. to reach a portion of the electrode layer 102 that is disposed outside of the recess defined by the substrate 101). In FIG. 3P, the through hole is filled, at least in part, with a photoresist material. In FIG. 3Q, a through hole through the photoresist PR layer, the dielectric layer 106, and the electrode layer 107 is formed to reach the electrode layer 105. In FIG. 3R, the photoresist PR layer is removed and a dielectric layer 110 is applied on to the electrode layer 107. The dielectric layer 110 may be a photosensitive polyimide layer. A through hole 110c through the dielectric layer 110 is formed to reach the electrode layer 107. The dielectric layer 110 may further define a through hole 110a reaching to the electrode layer 102 (e.g. reaching to a portion of the electrode layer 102 that is disposed outside of the recess defined by the substrate 101), and a through hole 110b reaching to the electrode layer 105.

In FIG. 3S, a conductive layer 111 is formed on the dielectric layer 110 and formed within the through holes 110a, 110b and 110c. The conductive layer 111 is electrically coupled to the electrode layers 102, 105 and 107. In FIG. 3T, a photoresist PR layer is applied on to the conductive layer 111. The photoresist PR layer is patterned by removing a portion of the PR layer. The remaining PR layer exposes the through holes 110a, 110b and 110c. In FIG. 3U, a conductive material is formed within the through holes 110a, 110b and 110c as a conductive via 109a, a conductive via 109b, and a conductive via 109c, respectively. In FIG. 3V, the conductive vias 109a and 109c are electrically coupled together and the remaining PR layer is removed. In FIG. 3W, a conductive contact 108a is formed to contact the conductive vias 109a and 109c and a conductive contact 108b is formed to contact the conductive via 109b. FIG. 3W shows an example of the capacitor structure 100 of FIG. 1.

Figure 4:
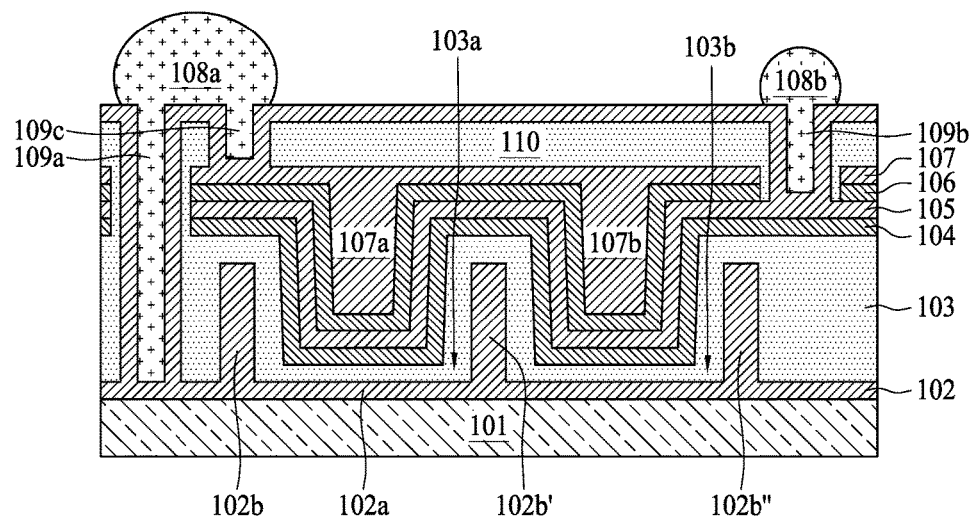
FIG. 4 is a cross-sectional view of a capacitor structure in accordance with some embodiments of the present disclosure.

FIG. 4 is a cross-sectional view of a capacitor structure 400 in accordance with some embodiments of the present disclosure. The capacitor structure 400 of FIG. 4 differs from the capacitor structure 100 of FIG. 1 in that the substrate 101 does not include a cavity recessed from a surface of the substrate 101 and in that the conductive post 102b, the conductive post 102b' and the conductive post 102b'' are not formed within such a cavity. Apart from the above-mentioned differences, the capacitor structure 400 of FIG. 4 may be substantially the same as the capacitor structure 100 of FIG. 1.

Figure 5A:
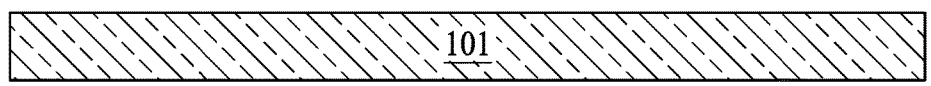
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O, FIG. 5P, FIG. 5Q, FIG. 5R, FIG. 5S, and FIG. 5T schematically illustrate operations for manufacturing a capacitor structure in accordance with some embodiments of the present disclosure.
Figure 5B:
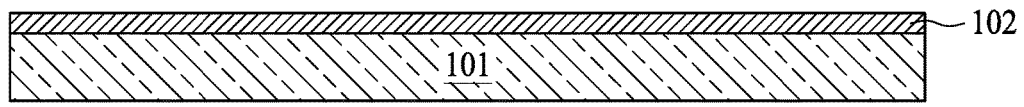
Figure 5C:
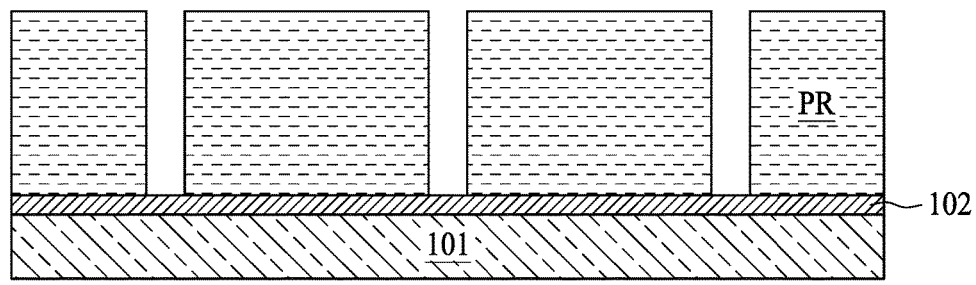
Figure 5D:
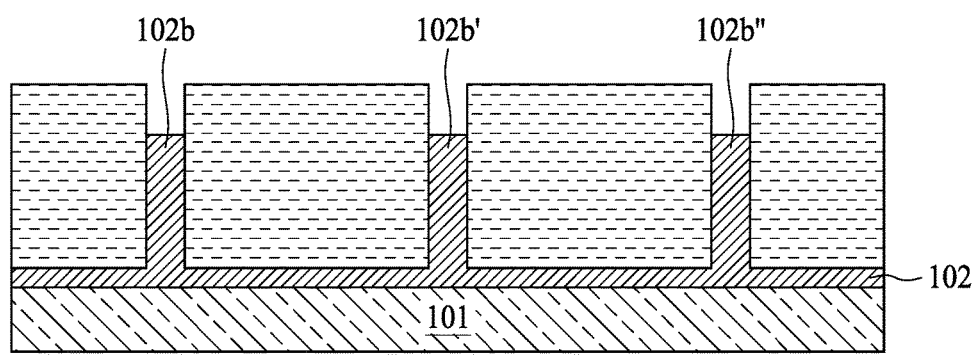
Figure 5E:
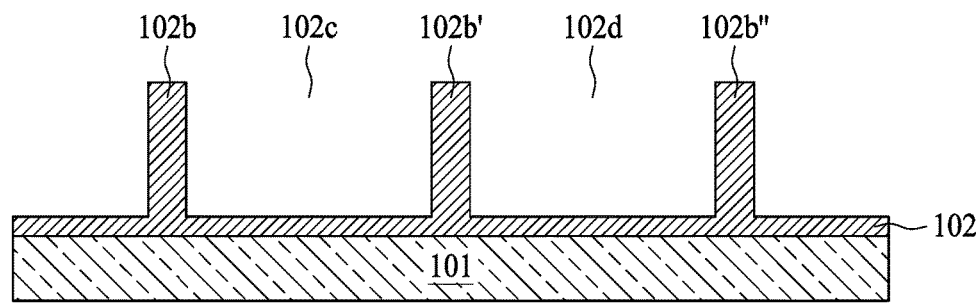
Figure 5F:
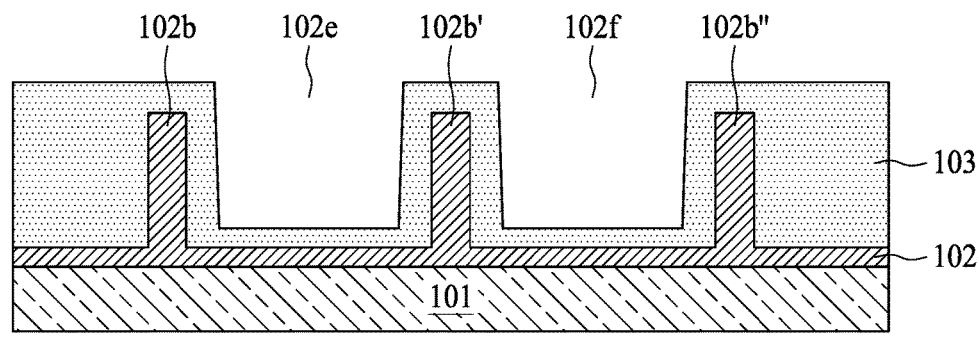
Figure 5G:
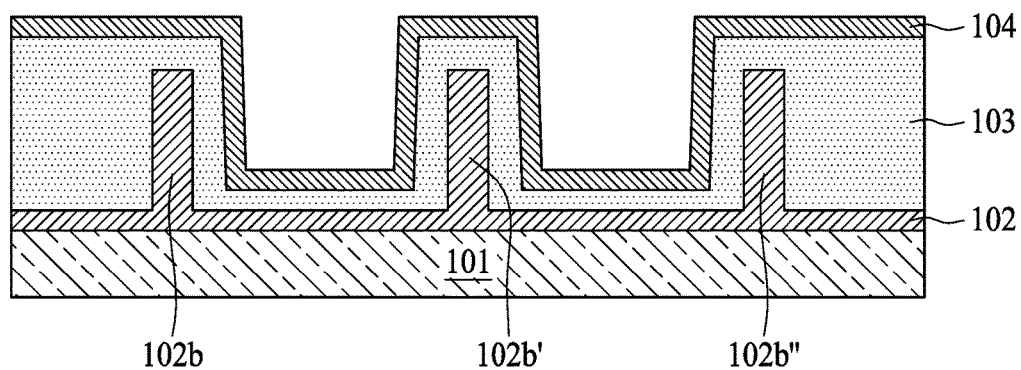
Figure 5H:
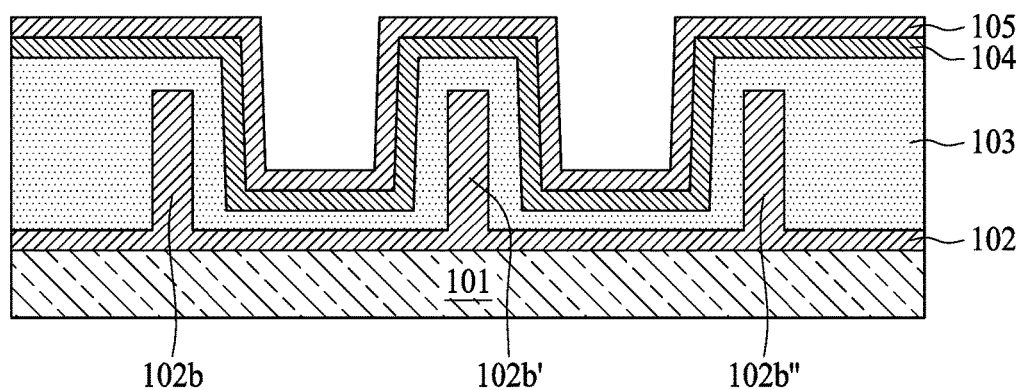
Figure 5I:
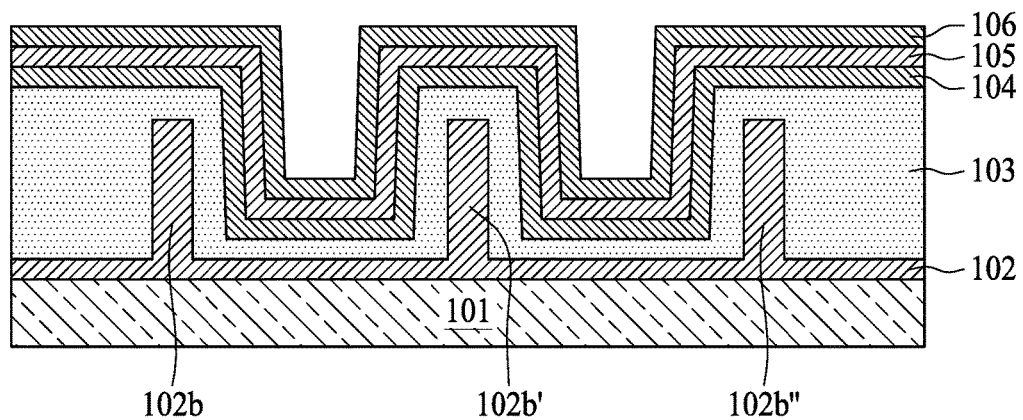
Figure 5J:
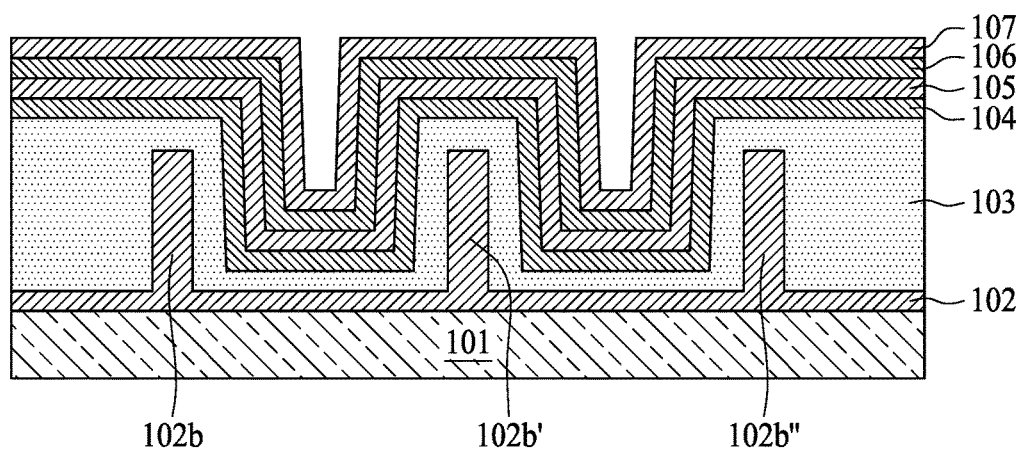
Figure 5K:
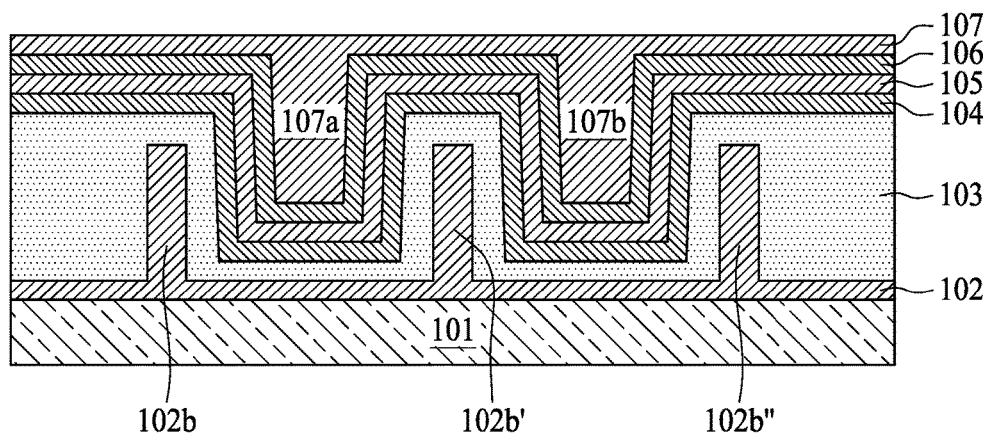
Figure 5L:
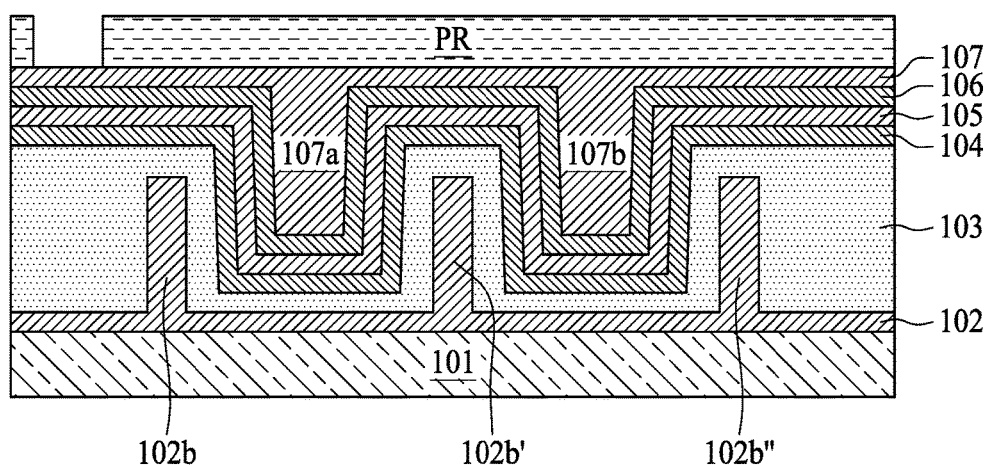
Figure 5M:
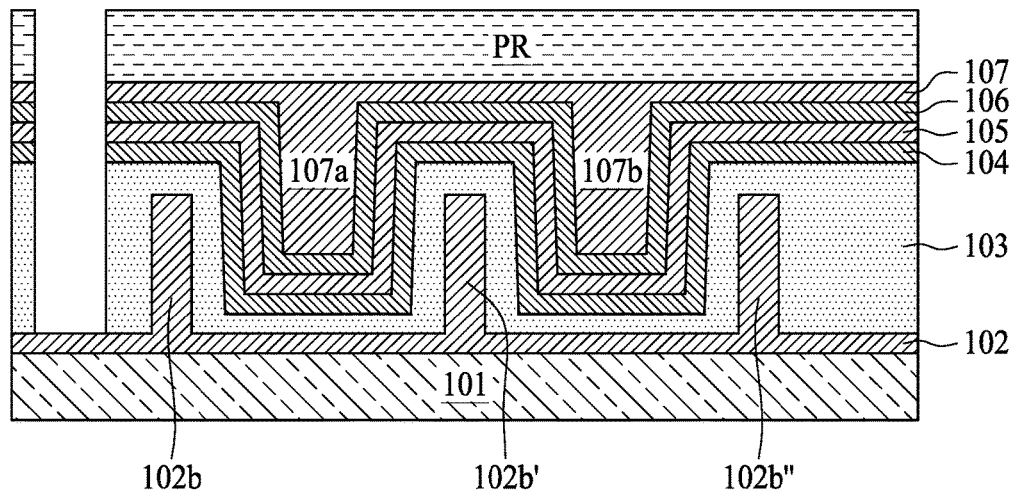
Figure 5N:
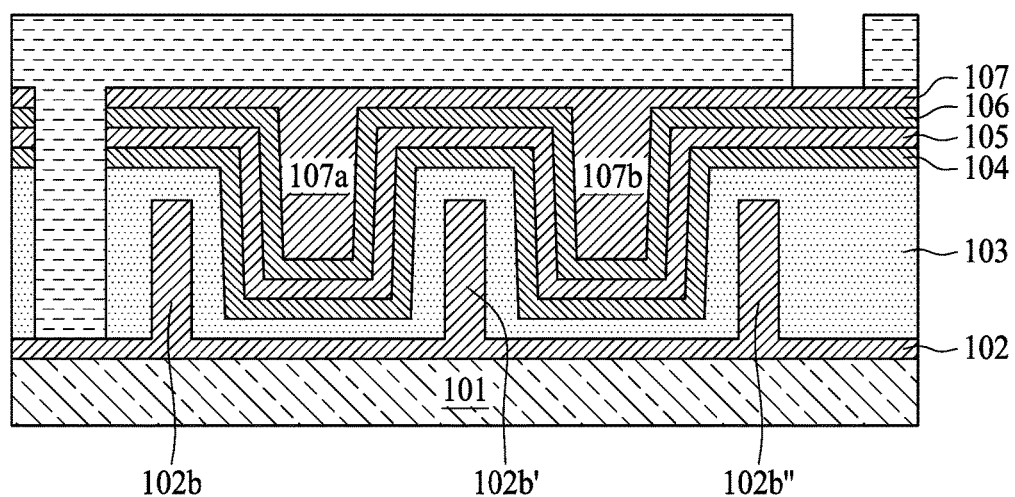
Figure 5O:
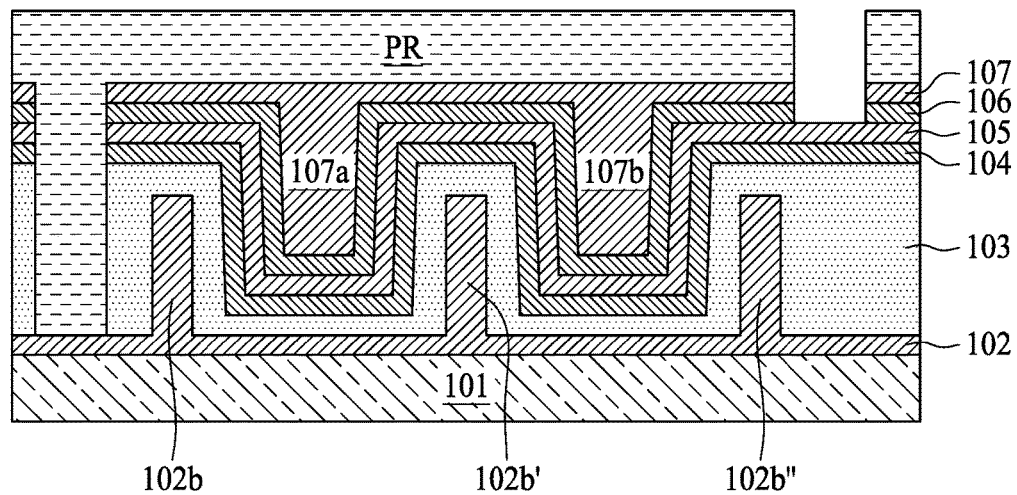
Figure 5P:
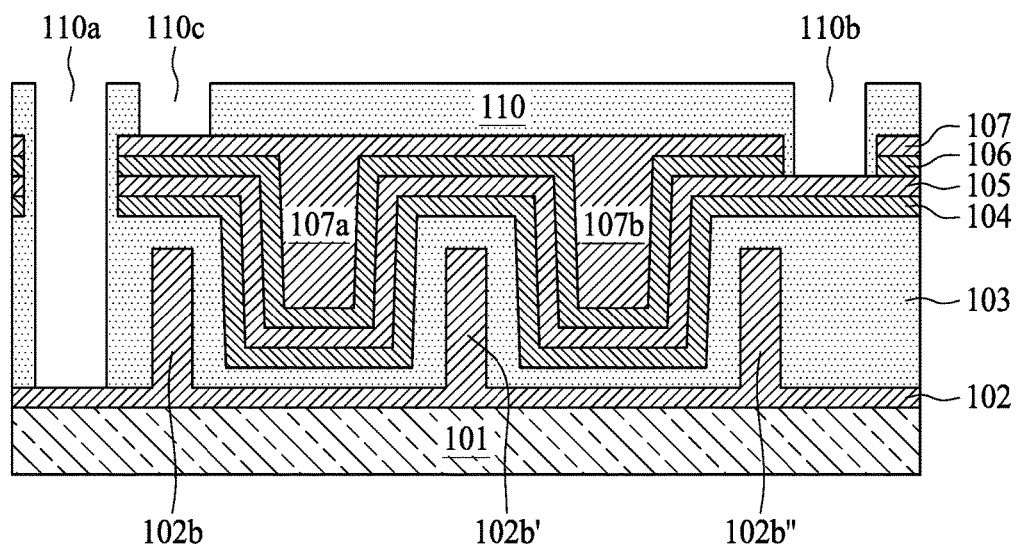
Figure 5Q:
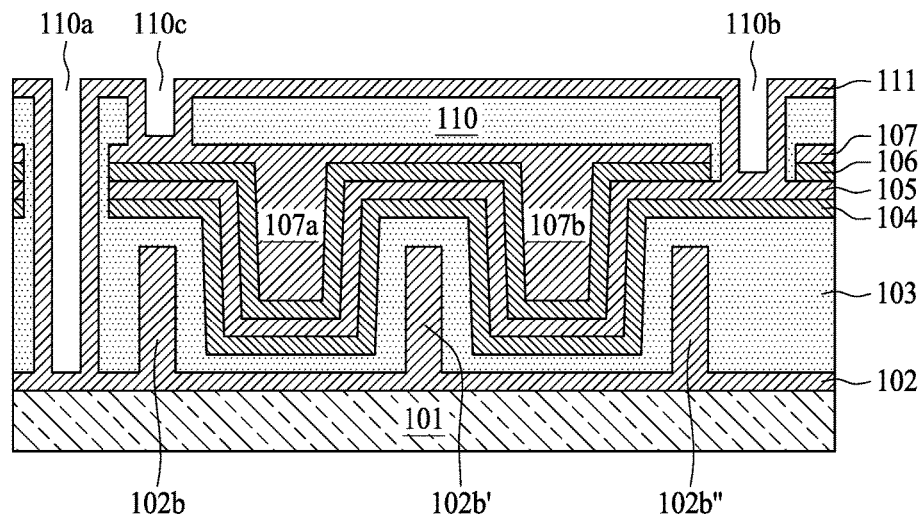
Figure 5R:
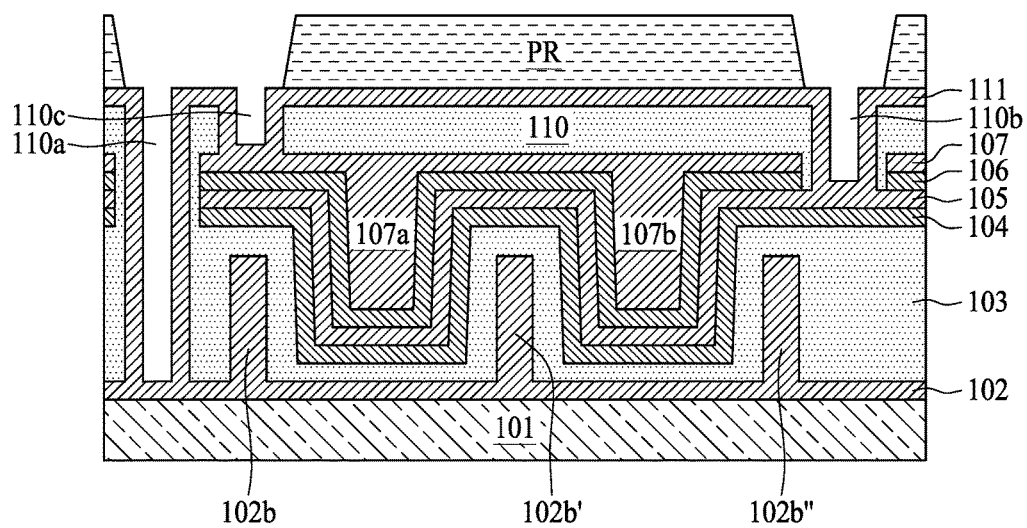
Figure 5S:
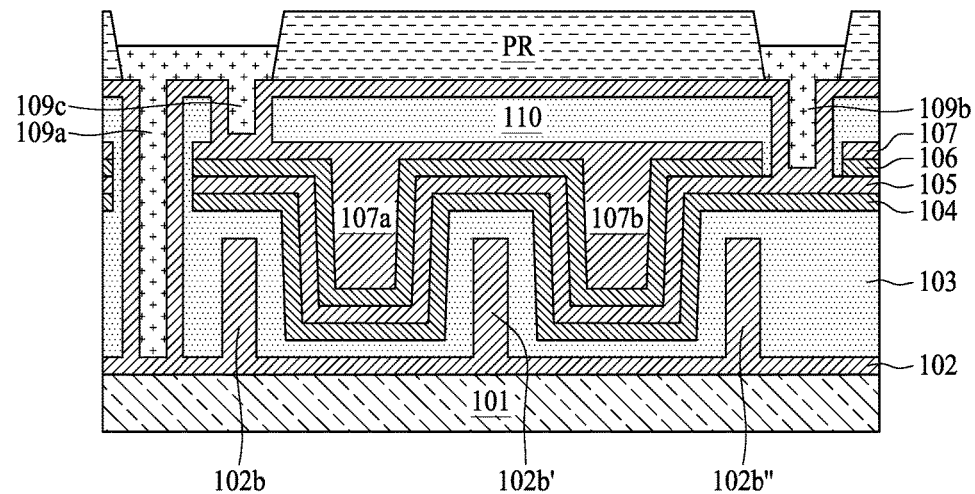
Figure 5T:
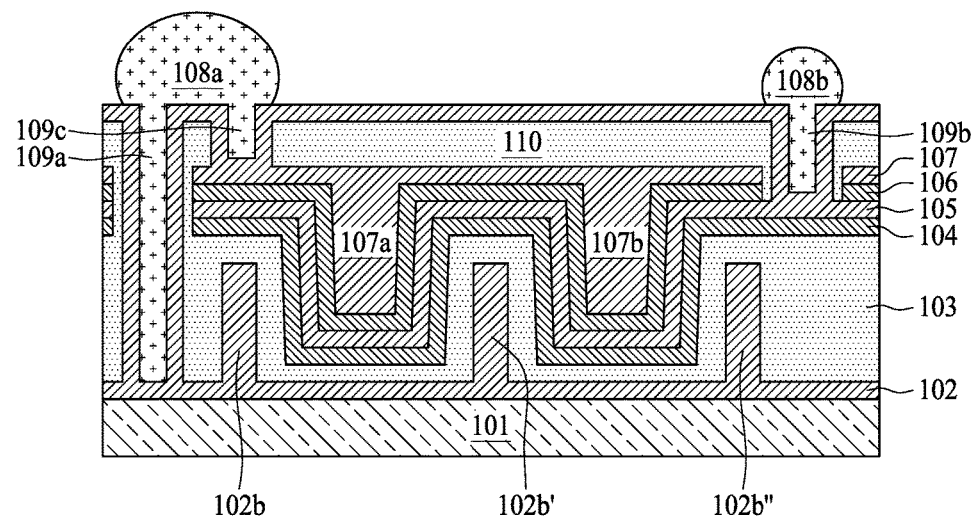

FIG. 5A though FIG. 5T schematically illustrate operations for manufacturing the capacitor structure 400 of FIG. 4 in which the substrate does not include a cavity. The operations shown in FIG. 5A through FIG. 5T are substantially the same as those shown in FIG. 3C through FIG. 3W (the operations of FIG. 3A through FIG. 3B which show forming a cavity are omitted), except that the operations shown in FIG. 5A through FIG. 5T are implemented using a substrate 101 that does not define the recess shown in FIG. 3A through FIG. 3W. FIG. 5T shows an example of the capacitor structure 400 of FIG. 4.

FIG. 6A and FIG. 6B illustrate examples of different types of semiconductor package devices in accordance with some embodiments of the present disclosure.

As shown in FIG. 6A, a plurality of capacitor structures 60 are placed on a square-shaped carrier 61. In some embodiments, the carrier 61 may include organic materials (e.g., a molding compound, a Bismaleimide-Triazine resin (BT), a PI, a polybenzoxazol (PBO), a solder resist, an Ajinomoto build-up film (ABF), a polypropylene (PP), an epoxy-based material, or a combination of two or more thereof) or inorganic materials (e.g., silicon, a glass, a ceramic, a quartz, or a combination of two or more thereof).

As shown in FIG. 6B, a plurality of capacitor structures 60 are placed on a circle-shaped carrier 62. In some embodiments, the carrier 62 may include organic materials (e.g., a molding compound, a BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

Figure 7B:
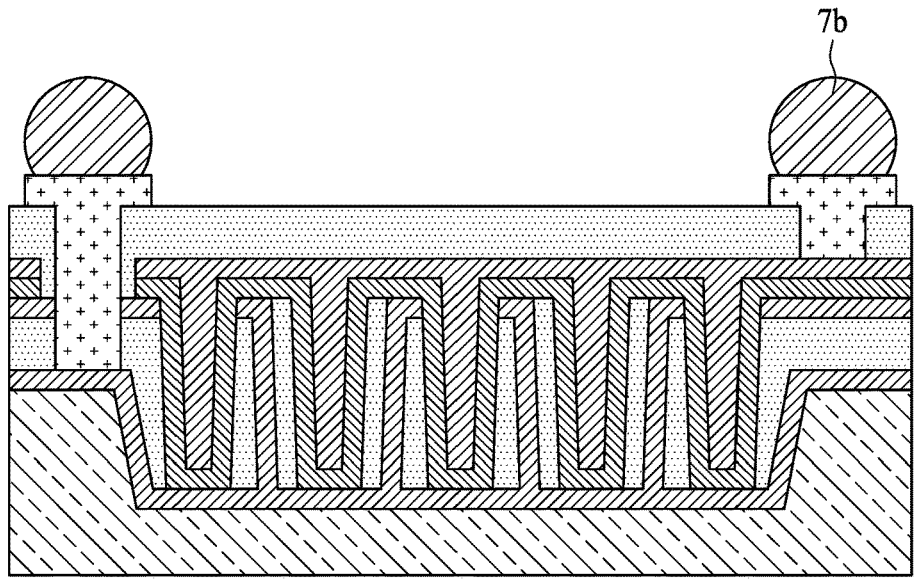
Figure 7C:
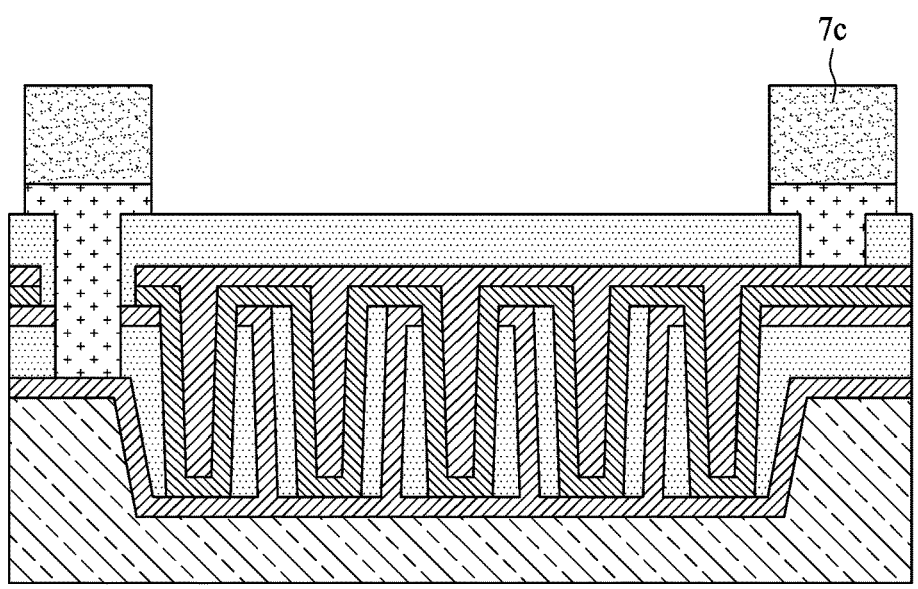
Figure 7D:
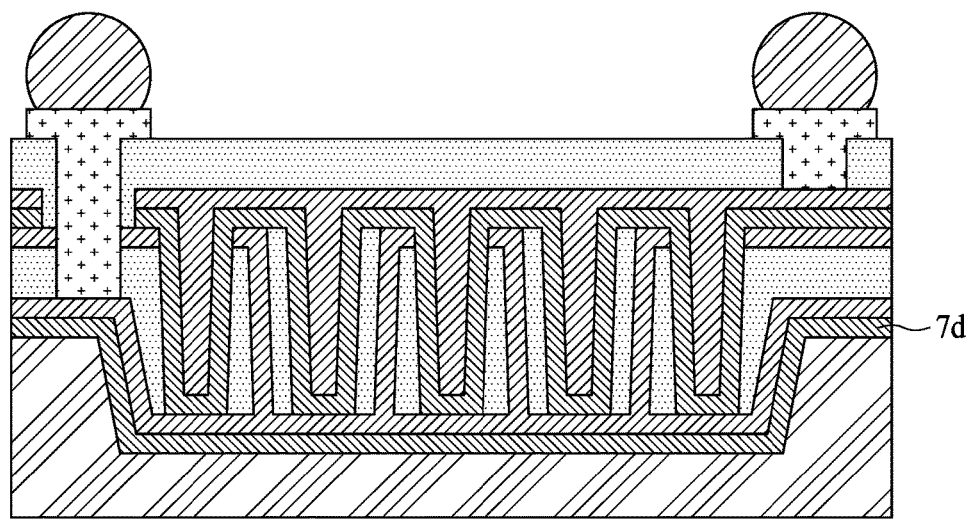

FIG. 7A through FIG. 7D schematically illustrate various capacitor structures in accordance with some embodiments of the present disclosure. In FIG. 7A, the conductive contacts for coupling the electrodes of the capacitor structure to external devices/components through conductive vias are metal pads 7a. In FIG. 7B, the conductive contacts for coupling the electrodes of the capacitor structure to external devices/components through conductive vias are solder bonding balls 7b. In FIG. 7C, the conductive contacts for coupling the electrodes of the capacitor structure to external devices/components through conductive vias are copper pillars 7c. In FIG. 7D, the substrate for carrying the capacitor structure includes molding compound materials, and a dielectric layer (e.g. a high quality factor (Q) material such as $Ta_2O_5$) is formed between the capacitor structure and the substrate. Using molding compound materials in the substrate provides for a lower cost, multi-functionality, and improved warpage control.

As used herein, the singular terms "a," "an," and "the" may include plural referents unless the context clearly dictates otherwise. In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A capacitor structure, comprising:
   a substrate;
   a first electrode disposed on the substrate, the first electrode comprising a conductive layer, a first conductive post electrically connected to the conductive layer and a second conductive post electrically connected to the conductive layer, wherein the substrate defines a cavity and the first conductive post and the second conductive post are disposed within the cavity;
   a planarization layer disposed on and covering the first electrode, the planarization layer disposed in a space between the first conductive post and the second conductive post;
   a first dielectric layer disposed on the planarization layer and in the space between the first conductive post and the second conductive post; and
   a second electrode disposed on the first dielectric layer.

2. The capacitor structure according to claim 1, wherein the planarization layer comprises a polymer layer.

3. The capacitor structure according to claim 2, wherein the polymer layer comprises polyimide.

4. The capacitor structure according to claim 1, wherein the second electrode is disposed in the space between the first conductive post and the second conductive post.

5. The capacitor structure according to claim 1, wherein the space between the first conductive post and the second conductive post constitutes a recess defined by the first conductive post, the second conductive post, and the conductive layer.

6. The capacitor structure according to claim 1, further comprising:
   a first conductive contact electrically connected to the first electrode; and
   a second conductive contact electrically connected the second electrode.

7. The capacitor structure according to claim 1, wherein the first dielectric layer comprises a metal oxide layer.

8. The capacitor structure according to claim 7, wherein the metal oxide layer comprises tantalum oxide.

9. The capacitor structure according to claim 1, wherein an aspect ratio of at least one of the first conductive post or the second conductive post is equal to or greater than about 7.

10. The capacitor structure according to claim 1, further comprising a second dielectric layer disposed on the second electrode and in the space between the first conductive post and the second conductive post.

11. The capacitor structure according to claim 1, further comprising a third electrode disposed on the second dielectric layer and in the space between the first conductive post and the second conductive post.

12. A capacitor structure, comprising:
   a substrate;
   a first electrode disposed on the substrate, the first electrode comprising a conductive layer and a plurality of conductive posts;
   a first dielectric layer disposed on the first electrode, at least a portion of the first dielectric layer surrounded by the plurality of conductive posts;
   a second electrode disposed on the first dielectric layer;
   a second dielectric layer disposed on the second electrode;
   a third electrode disposed on the second dielectric layer;
   a first conductive contact electrically connected to the first and third electrodes; and
   a second conductive contact electrically connected to the second electrode.

13. The capacitor structure according to claim 12, further comprising a first conductive via, a second conductive via, and a third conductive via, wherein the first electrode is electrically connected to the first conductive contact by the first conductive via, the second electrode is electrically connected to the second conductive contact by the second conductive via, and the third electrode is electrically connected to the first conductive contact by the third conductive via.

14. The capacitor structure according to claim 12, wherein an aspect ratio of at least one of the plurality of conductive posts is equal to or greater than about 7.

15. The capacitor structure according to claim 12, wherein the substrate defines a cavity accommodating at least one of the plurality of conductive posts.

16. The capacitor structure according to claim 12, further comprising a planarization layer disposed between the first electrode and the first dielectric layer, wherein at least a portion of the planarization layer is surrounded by the plurality of conductive posts.

17. The capacitor structure according to claim 16, wherein at least a portion of the second electrode is surrounded by the first dielectric layer, and wherein at least a portion of the second dielectric layer is surrounded by the second electrode.

18. A method of forming a capacitor structure, comprising:

providing a substrate, wherein the substrate defines a cavity;

forming a first electrode on the substrate, the first electrode comprising a conductive layer and a plurality of conductive posts disposed on and electrically connected to the conductive layer, the plurality of conductive posts defining at least one first recess having one or more sidewalls and a bottom surface, wherein the plurality of conductive posts are disposed within the cavity;

forming a planarization layer overlying the first electrode and covering the one or more sidewalls and the bottom surface of the at least one first recess;

forming a first dielectric layer overlying the planarization layer; and forming a second electrode overlying the first dielectric layer.

19. The method according to claim 18, wherein forming the planarization layer further comprising:

forming a photosensitive polymer layer on the first electrode and filling at least a portion of the at least one first recess; and optically removing at least a portion of the photosensitive polymer layer to define at least one second recess.

* * * * *